(12) United States Patent
Das et al.

(10) Patent No.: US 8,914,495 B2
(45) Date of Patent: Dec. 16, 2014

(54) AUTOMATICALLY DETECTING AND LOCATING EQUIPMENT WITHIN AN EQUIPMENT RACK

(75) Inventors: Rajarshi Das, Armonk, NY (US); Wael R. El-Essawy, Austin, TX (US); Thomas W. Keller, Jr., Austin, TX (US); Jeffrey O. Kephart, Cortlandt Manor, NY (US); Juan C. Rubio, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 787 days.

(21) Appl. No.: 13/154,825

(22) Filed: Jun. 7, 2011

(65) Prior Publication Data

US 2012/0317265 A1    Dec. 13, 2012

(51) Int. Cl.
*G06F 15/173* (2006.01)
*H05K 7/14* (2006.01)

(52) U.S. Cl.
CPC .................................. *H05K 7/1498* (2013.01)
USPC ........................................................ 709/224

(58) Field of Classification Search
CPC ................................ G06F 15/177; G06F 9/00
USPC ........................................................ 709/224
See application file for complete search history.

(56) References Cited

U.S. PATENT DOCUMENTS

| | | | |
|---|---|---|---|
| 6,044,411 A | 3/2000 | Berglund et al. | |
| 6,762,691 B2 | 7/2004 | Piazza | |
| 6,883,125 B2 | 4/2005 | Abbondanzio et al. | |
| 6,968,414 B2 | 11/2005 | Abbondanzio et al. | |
| 7,013,462 B2 | 3/2006 | Zara et al. | |
| 7,071,825 B2 | 7/2006 | VoBa | |
| 7,187,265 B1 | 3/2007 | Senogles et al. | |
| 7,302,593 B2 | 11/2007 | Rothman et al. | |
| 7,460,978 B1 | 12/2008 | Brey et al. | |
| 2002/0091463 A1 | 7/2002 | Piazza | |
| 2004/0267924 A1 | 12/2004 | Yang et al. | |
| 2006/0097863 A1 | 5/2006 | Horowitz et al. | |
| 2006/0171538 A1 | 8/2006 | Larson et al. | |
| 2008/0177969 A1 | 7/2008 | Miriyala et al. | |
| 2008/0222310 A1 | 9/2008 | Karstens | |
| 2008/0272887 A1 | 11/2008 | Brey et al. | |
| 2009/0138313 A1 | 5/2009 | Morgan et al. | |

FOREIGN PATENT DOCUMENTS

EP    2128766 A2    12/2009

OTHER PUBLICATIONS

"DS2406 Dual Addressable Switch Plus 1Kb Memory", http://datasheets.maxim-ic.com/en/ds/DS2406.pdf, Mar. 31, 2009, 32 pages.

*Primary Examiner* — Shripal Khajuria
(74) *Attorney, Agent, or Firm* — Francis Lammes; Stephen J. Walder, Jr.; William J. Stock

(57) ABSTRACT

A mechanism is provided for automatically detecting and locating equipment within an intelligent equipment rack. The intelligent equipment rack comprises a rack controller that determines whether a signal has been received indicating that a rack space in a plurality of rack spaces in the intelligent equipment rack has been occupied by a piece of electronic equipment. Responsive to receiving the signal indicating that the rack space has been occupied by the piece of electronic equipment, the rack controller updates a rack information table in the memory with occupation information related to the rack space occupied by the piece of electronic equipment.

21 Claims, 4 Drawing Sheets

AUTOMATICALLY DETECTING AND LOCATING EQUIPMENT WITHIN AN EQUIPMENT RACK

BACKGROUND

The present application relates generally to an improved data processing apparatus and method and more specifically to mechanisms for automatically detecting and locating equipment within an equipment rack.

Whether a small enterprise has electronic equipment in one room or a much larger enterprise has electronic equipment in many rooms in various facilities all over the world, each of these enterprises need to maintain an accurate inventory of the equipment in their facilities. Having a reliable inventory of the electronic equipment is a time consuming operation and is generally required for several energy management optimizations, such as cooling, power management, or the like. While current solutions of tracking inventory include the use of barcodes or radio frequency identification (RFID), these current solutions may have numerous issues or problems, such as requiring a separate database to associate barcode or tags to the electronic equipment, an additional cost of having to tag each piece of electronic equipment, human intervention of having to verify position or location of each piece of electronic equipment within an equipment rack, keeping track of electronic equipment that has been removed from an equipment rack, or determining whether space is available in an equipment rack.

SUMMARY

In one illustrative embodiment, a method, in a data processing system, is provided for automatically detecting and locating equipment within an intelligent equipment rack. The illustrative embodiment determines whether a signal has been received indicating that a rack space in a plurality of rack spaces in the intelligent equipment rack has been occupied by a piece of electronic equipment. The illustrative embodiment updates a rack information table in the memory with occupation information related to the rack space occupied by the piece of electronic equipment in response to receiving the signal indicating that the rack space has been occupied by the piece of electronic equipment.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for automatically detecting and locating equipment within an equipment rack. The mechanism comprises a rack that recognizes electronic equipment that is installed in or removed from an equipment rack by, for example, type of equipment, model number, serial number, or the like. Also provided is a mechanism that allows electronic equipment to query the equipment rack with which it is installed to find out its own physical location. An additional mechanism is provided for a central management system to build a detailed, dynamically up-to-date, accurate inventory of the electronic equipment by querying each of the equipment racks within the enterprise.

Figure 1:
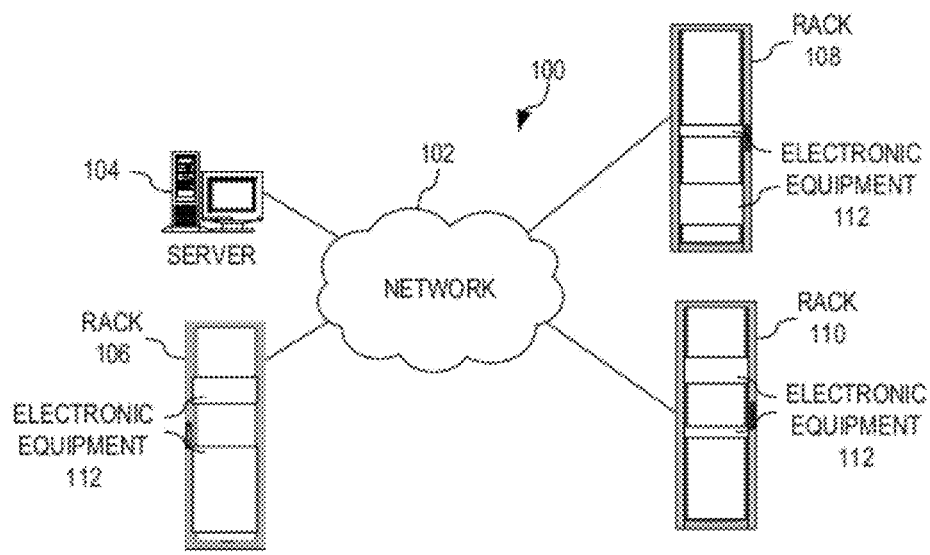
FIG. 1 is a representation of an exemplary distributed data processing system in which aspects of the illustrative embodiments may be implemented.
Figure 2:
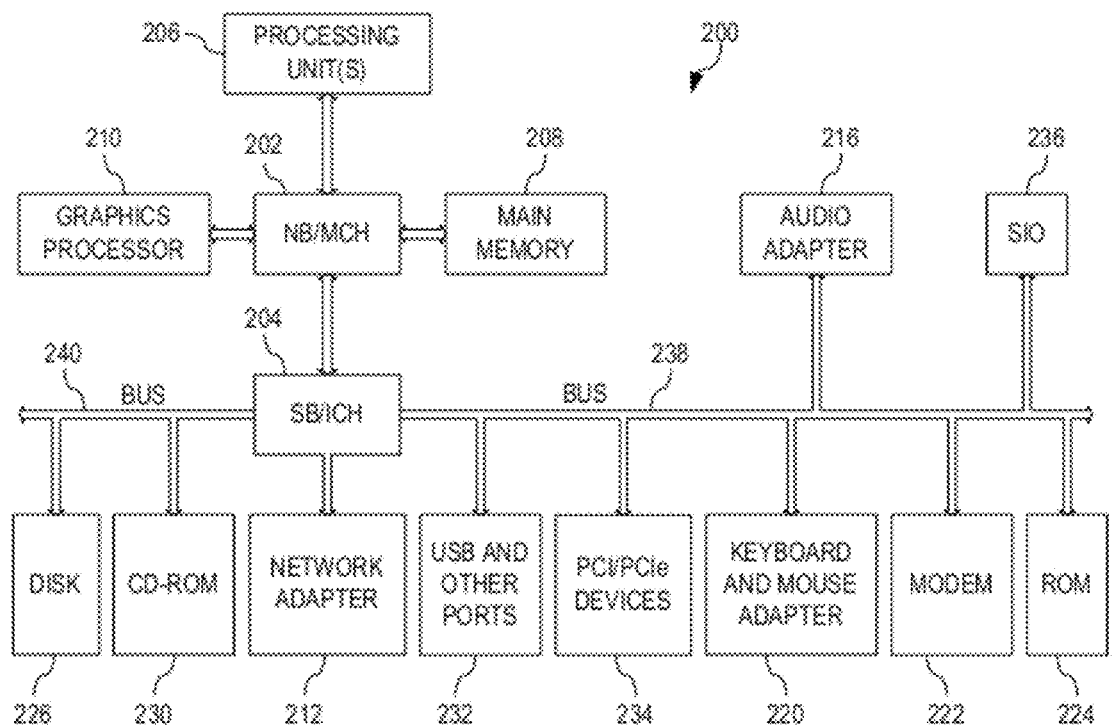
FIG. 2 shows a block diagram of an example data processing system in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 is a representation of an exemplary distributed data processing system in which aspects of the illustrative embodiments may be implemented. Distributed data processing system 100 may include a network of data processing systems in which aspects of the illustrative embodiments may be implemented. Distributed data processing system 100 may also be referred to as a network node, which is a grouping of one or more network elements, at one or more sites, which provides network related functions, and is administered as a single entity. A single site may contain more than one network node. Distributed data processing system 100 contains at least one network 102, which is the medium used to provide communication links between various devices and computers connected together within distributed data processing system 100. Network 102 may include connections, for example, wired links, wireless communication links, fiber optic cables, or the like.

In the depicted example, central management system 104 and a plurality of intelligent equipment racks 106, 108, and 110 are coupled to network 102. Each of intelligent equipment racks 106, 108, and 110 further comprise electronic equipment 112 that may also be coupled to network 102. Each of electronic equipment 112 may be mounted within intelligent equipment racks 106, 108, and 110 within distributed data processing system 100. One or more intelligent equipment racks 106, 108, and 110 housing elements, such as electronic equipment 112, may be referred to as a rack-mounted system. Each of electronic equipment 112 may comprise field replaceable units (FRU). A FRU may be, for examples, a circuit board, part, or assembly that may be quickly and easily removed from a computer server or other piece of electronic equipment and replaced b the user or by a technician without having to send the entire product or system to a repair facility. Examples of electronic equipment 112 may be computers, routers, switches, modular storage elements, controllers, printers, serial attached SCSI hard disk drive (SAS HDD), or the like. Each of electronic equipment 112 may have a unique network address, sometimes called a data link control (DLC) address, media access control (MAC) address, or the like.

The unique network address may be part of vital product data (VPD) of electronic equipment 112. VPD is information provided in association with electronic equipment 112, such as in a storage device of electronic equipment 112, and which may be detected by intelligent equipment racks 106, 108, or 110 when electronic equipment 112 are installed in intelligent equipment racks 106, 108, and 110, for example. VPD information may also be provided separately for electronic equipment 112, and may be entered into an interface of intelligent equipment racks 106, 108, and 110. The unique network address allows electronic equipment 112 to be identified at a system or network level by intelligent equipment racks 106, 108, and 110 and/or central management system 104. Vital product data may include element model number, a unique serial number, product release level, maintenance level, address, other information specific to the device type, or the like. Vital product data may also include user-defined information, such as the building, room, row, rack, position, or the like, for electronic equipment 112. The collection and use of vital product data allows the status of data processing system 100 to be understood and service provided more quickly.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as central management system 104, intelligent equipment racks 106, 108, and 110, and electronic equipment 112 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 200 (Java is a trademark of Oracle and/or its affiliates.).

As a server, data processing system 200 may be, for example, an IBM® eServer™ System p® computer system, running the Advanced Interactive Executive) (AIX®) operating system or the LINUX operating system (IBM, eServer, System p, and AIX are trademarks of International Business Machines Corporation in the United States, other countries, or both, and LINUX is a registered trademark of Linus Torvalds the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems. In some illustrative examples, data processing system 200 may be a computing device which is configured with flash memory to provide non-volatile memory for storing operating system files and/or user-generated data, for example. Essentially, data processing system 200 may be any known or later developed data processing system without architectural limitation.

Figure 3:
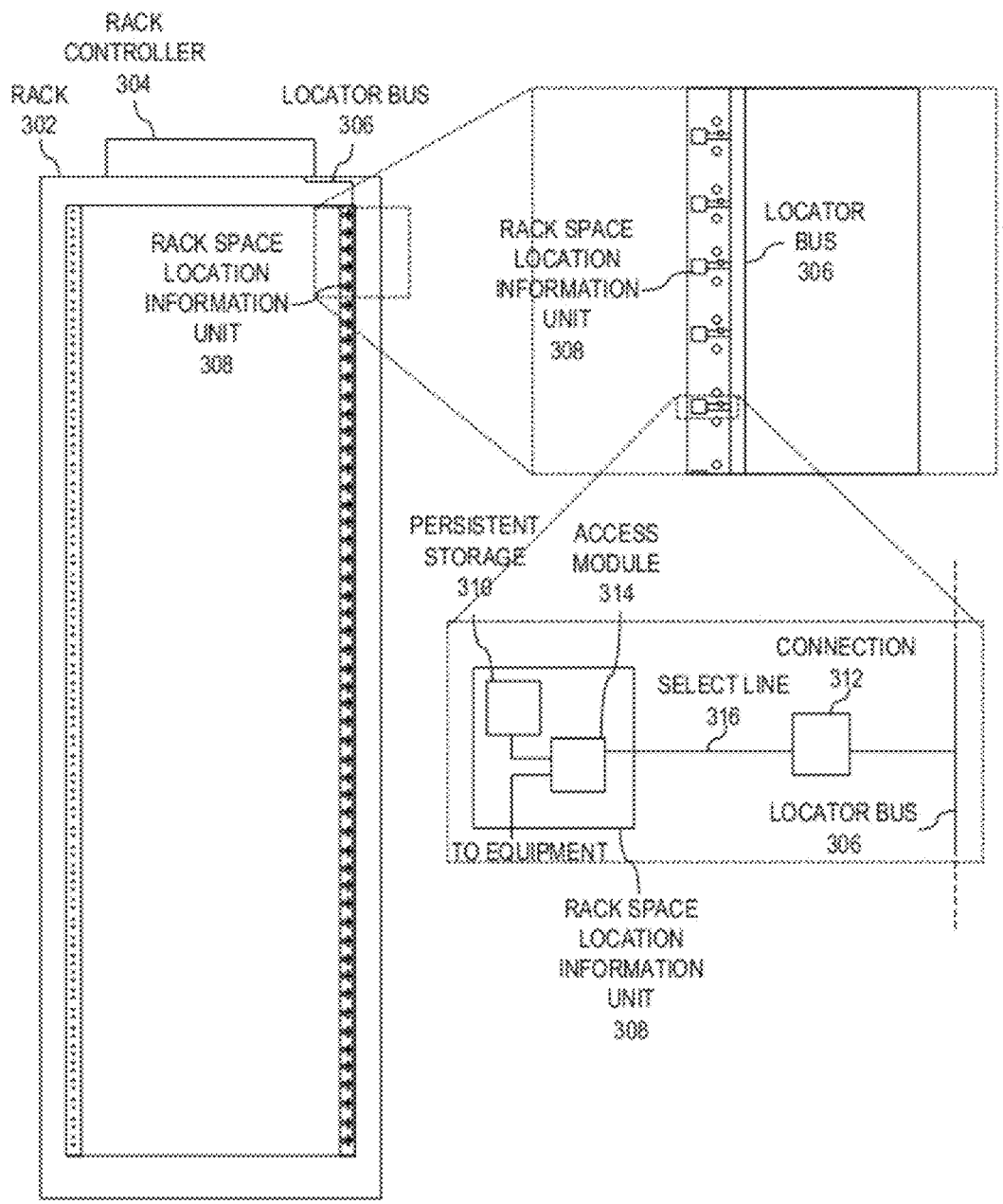
FIG. 3 depicts one example of an intelligent equipment rack in accordance with an illustrative embodiment.

FIG. 3 depicts one example of an intelligent equipment rack in accordance with an illustrative embodiment. Intelligent equipment rack 302 comprises rack controller 304, locator bus 306, and a plurality of per rack space location information units 308. During manufacturing of intelligent equipment rack 302, each per rack space location information unit 308 is preprogrammed with a given rack space identifier within intelligent equipment rack 302, which is stored in persistent storage 310. When intelligent equipment rack 302 is installed within a facility, an installer or administrator may program rack controller 304 with rack information such as a rack identifier, rack coordinates, row identifier, room identifier, building identifier, contact information for equipment administrator or owner, a Uniform Resource Locator (URL) link to a rack in an enterprise system management software, or the like. Once programmed, rack controller 304 may periodically scan locator bus 306 in order to determine whether one or more pieces of electronic equipment has been installed within intelligent equipment rack 302.

When a piece of electronic equipment is installed within intelligent equipment rack 302, a contact, protrusion, or the like, on the electronic equipment causes connection 312 to identify that a piece of electronic equipment has been installed in a rack space. Connection 312 identifies that a piece of electronic equipment has been installed in a rack space in various ways, for example, a contact on the piece of electronic equipment may close connection 312 (if connection 312 is a normally open connection) thereby providing an indication that a piece of electronic equipment has been installed in the rack space, a protrusion on the piece of electronic equipment may open connection 312 (if connection 312 is a normally closed connection) thereby providing an indication that a piece of electronic equipment has been installed in the rack space, or through other types of identification.

Once connection 312 is activated by the insertion of an equipment in the rack space, the rack space location information unit 308 is visible in locator bus 306 by means of select line 316, such that the given rack space identifier stored in persistent storage 310 is made available to both rack controller 304 as well as to the piece of electronic equipment. Once rack controller 304 identifies that the specified rack space is occupied, then rack controller 304 may write its rack information to the piece of electronic equipment. That is, either through connection 312 or through some other means of connection (not shown) to the piece of electronic equipment, not only would the piece of electronic equipment be able to read the given rack space identifier from persistent storage 310 but the piece of electronic equipment may also receive information from rack controller 304 that comprises rack information such as a rack identifier, rack coordinates, row identifier, room identifier, building identifier, or the like.

Further, through connection 312 or through some other means of connection (not shown), the piece of electronic equipment may provide equipment information to rack controller 304, such as a unique network address, a network address of a system management interface, a media access control (MAC) address, or the like, as well as vital product data (VPD) comprising element model number, a unique serial number, product release level, maintenance level, contact information for equipment administrator or owner, other information specific to the device type, or the like. Further, since a piece of equipment may occupy more than one rack space, the electronic equipment may also provide dimensional information that rack controller 304 may use to fully recognize the number of rack spaces the piece of electronic equipment occupies as well as the direction of those occupied spaces. That is, if a piece of electronic equipment occupies five rack spaces, the electronic equipment may notify rack controller 304 that the equipment occupies five rack spaces, the connection is made on the middle space, and there are two occupied spaces both above and below the connection space. Access module 314 filters and routes communication between locator bus 306 and persistent storage 310, between locator bus 306 and the electronic equipment, and between persistent storage 310 and the electronic equipment. Access module 314 is configured so rack controller 304 and electronic equipment installed in rack 302 only have access to information deemed necessary by system administrators.

Figure 4:
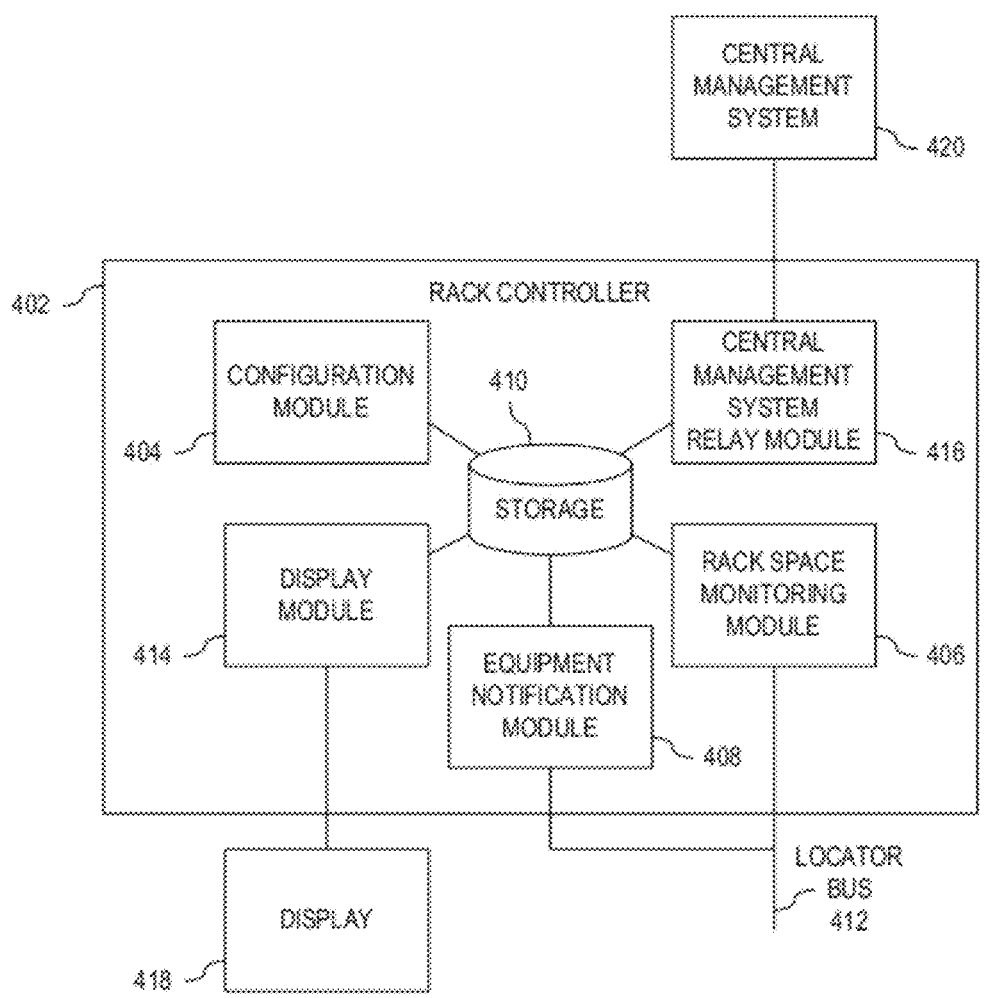
FIG. 4 depicts a functional block diagram of a rack controller in accordance with an illustrative embodiment.

FIG. 4 depicts a functional block diagram of a rack controller, such as rack controller 304 in FIG. 3, in accordance with an illustrative embodiment. Rack controller 402 may comprise configuration module 404, rack space monitoring module 406, equipment notification module 408, and storage 410. When the intelligent equipment rack, with which rack controller 402 is associated, is installed within a facility, an installer or administrator may program rack controller 402 using configuration module 404 with rack information such as a rack identifier, rack coordinates, row identifier, room identifier, building identifier, or the like, which is updated in a rack information table and then stored in storage 410. Once programmed, rack space monitoring module 406 periodically scans using a locator bus 412 in order to determine whether one or more pieces of electronic equipment has been installed within the intelligent equipment rack.

When a piece of electronic equipment is installed within the intelligent equipment rack, rack space monitoring module 406 receives an indication that a piece of electronic equipment has been installed in a rack space by receiving a given rack space identifier associated with the persistent storage of that rack space. Rack space monitoring module 406 then updates the rack information table with the identification that the identified rack space is now occupied. Once rack controller 402 is informed that the specified rack space is occupied, then equipment notification module 408 writes rack information to the piece of electronic equipment, such as a rack identifier, rack coordinates, row identifier, room identifier, building identifier, or the like.

Further, if the piece of electronic equipment provides additional equipment information to rack controller 402, rack space monitoring module 406 may receive the equipment information and update the rack information table. The equipment information may comprise information, such as a unique network address, a media access control (MAC) address, or the like, as well as vital product data (VPD) comprising element model number, a unique serial number, product release level, maintenance level, address, other information specific to the device type, or the like. Further, rack space monitoring module 406 may receive equipment information that identifies a number of rack spaces occupied by the electronic equipment, a connection point of the electronic equipment, and directions of the other occupied spaces. Rack space monitoring module 406 then updates the rack information table with the equipment information.

Rack controller 402 may also comprise display module 414 and central management system relay module 416. Display module 414 may be used to update display 418 associated with rack controller 402 so that rack information, such as a rack identifier, rack coordinates, row identifier, room identifier, building identifier, or the like may be displayed on display 418. Central management system relay module 416 may be used to relay rack/equipment information from the rack information table to a central management system 420 so that detailed, dynamic, up-to-date, and accurate inventory of the electronic equipment may be made for the enterprise.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, etectro-magnetic, optical, or any suitable combination thereof. A computer readable signal medium may be any computer readable medium that is nota computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RE), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 5:
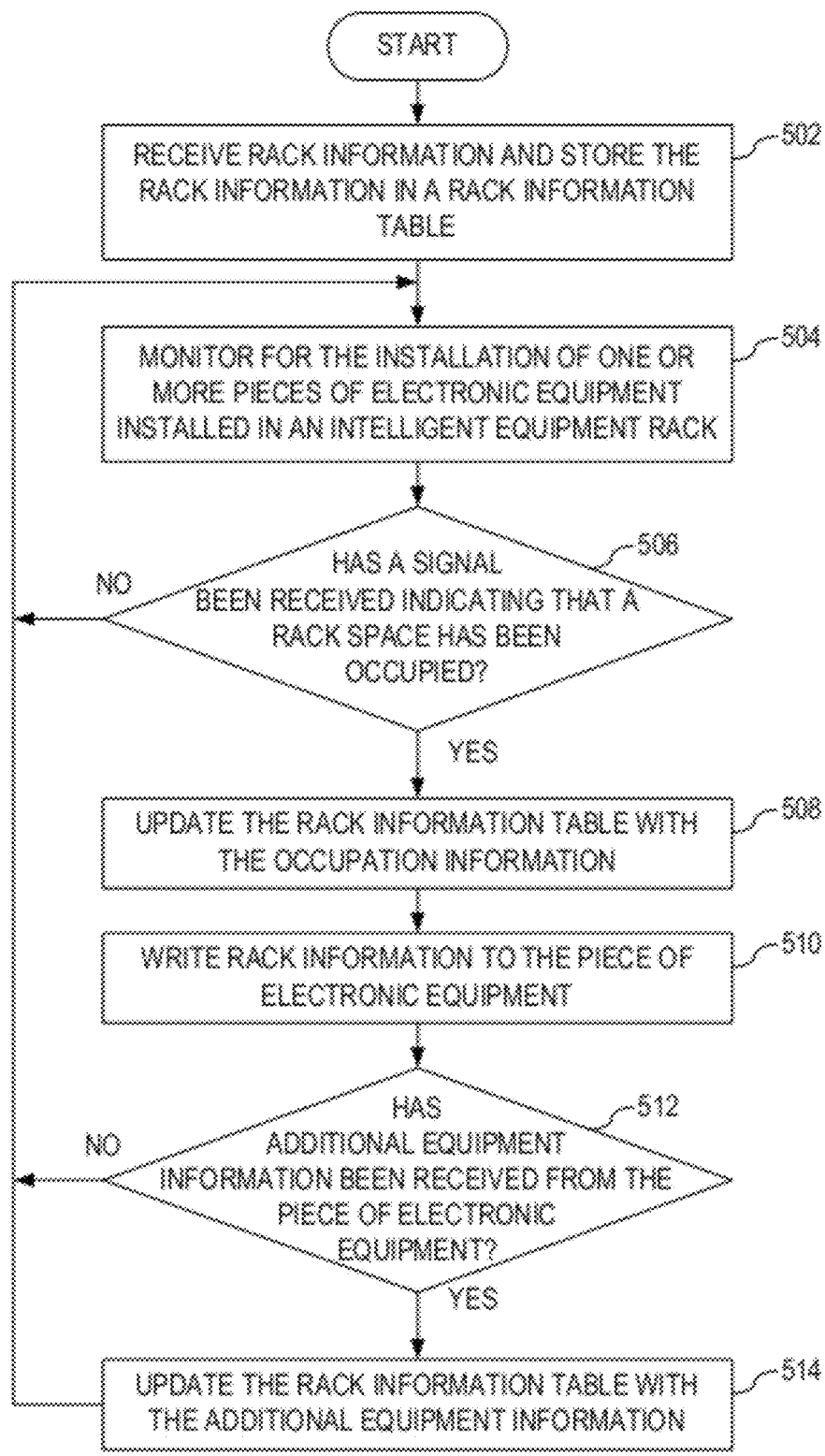
FIG. 5 is a flow diagram of the operation performed by a rack controller in accordance with an illustrative embodiment.

FIG. 5 is a flow diagram of the operation performed by a rack controller in accordance with an illustrative embodiment. As the operation begins, the rack controller receives rack information and stores the rack information in a rack information table (step 502). The rack information may comprise a rack identifier, rack coordinates, row identifier, room identifier, building identifier, departmental owner information, a Uniform Resource Locator (URL) link to a rack in an enterprise system management software, or the like. The rack controller then monitors for the installation of one or more pieces of electronic equipment installed in an intelligent equipment rack with which the rack controller is associated (step 504). The rack controller then determines whether a signal has been received indicating that a rack space has been occupied by a piece of electronic equipment (step 506). If at step 506 the rack controller fails to receive such a signal, then the operation returns to step 504.

If at step 506 the rack controller receives a signal that indicates that a rack space has been occupied by apiece of electronic equipment, then the rack controller updates the rack information table with the occupation information (step 508). The rack controller then writes rack information to the piece of electronic equipment (step 510). The rack information may comprise a rack identifier, rack coordinates, row identifier, room identifier, building identifier, or the like. The rack controller then determines whether additional equipment information is received from the piece of electronic equipment (step 512). The equipment information may comprise information, such as a unique network address, a media access control (MAC) address, or the like, as well as vital product data (VPD) comprising element model number, a unique serial number, product release level, maintenance level, address, other information specific to the device type, or the like. Further, the equipment information may identify a number of rack spaces occupied by the electronic equipment, a connection point of the electronic equipment, and directions of the other occupied spaces. If at step 512 no additional equipment information is received, then the operation returns to step 504. If at step 512 the additional equipment information is received, then the rack controller updates the rack information table with the additional equipment information (step 514), with the operation returning to step 504 thereafter.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in act, be executed substantially concurrently, or the blocks may sometimes be executed in the reverse order, depending upon the functionality involved will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms for automatically detecting and locating equipment within an equipment rack. The mechanism comprises a rack that recognizes electronic equipment that is installed in or removed from an equipment rack by, for example, type of equipment, model number, serial number, or the like. Also provided is a mechanism that allows electronic equipment to query the equipment rack with which it is installed to find out its own physical location. An additional mechanism is provided for a central management system to build a detailed, dynamically up-to-date, accurate inventory of the electronic equipment by querying each of the equipment racks within the enterprise.

As noted above, it should be appreciated that the illustrative embodiments may take the form of an entirety hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, hulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An intelligent equipment rack, comprising:
a rack controller; and
a memory coupled to a processor in the rack controller, wherein the memory comprises instructions which, when executed by the processor, cause the processor to:
determine whether a signal has been received indicating that a rack space in a plurality of rack spaces in the intelligent equipment rack has been occupied by a piece of electronic equipment;
responsive to receiving the signal indicating that the rack space has been occupied by the piece of electronic equipment, update a rack information table in the memory with occupation information related to the rack space occupied by the piece of electronic equipment;
receive first equipment information specific to the piece of electronic equipment from the piece of electronic equipment, wherein the first equipment information comprises a number of rack spaces occupied by the electronic equipment, a connection point of the electronic equipment, and directions of other spaces occupied by the electronic equipment; and update the rack information table in the memory with the first equipment information provided by the piece of electronic equipment.

2. The intelligent equipment rack of claim 1, wherein the instructions further cause the processor to:
write rack information to the piece of electronic equipment, wherein the rack information comprises at least one of a rack identifier, rack coordinates, or a row identifier.

3. The intelligent equipment rack of claim 1, wherein the instructions further cause the processor to:
receive a second equipment information specific to the piece of electronic equipment from the piece of electronic equipment, wherein the second equipment information comprises at least one of a unique network address, a network address of a system management interface, a media access control (MAC) address, a model number, a unique serial number, product release level, maintenance level, contact information for equipment administrator or owner, or device type; and
update the rack information table in the memory with the second-equipment information provided by the piece of electronic equipment.

4. The intelligent equipment rack of claim 1, wherein the signal identifies a specific rack space in the plurality of rack spaces, wherein the identification of the specific rack space is provided by a persistent storage associated with the specific rack space, wherein the signal is initiated by the piece of electronic equipment being installed in the intelligent equipment rack and a connection being made, and wherein the connection is at least one of a contact on the piece of electronic equipment closing the connection if the connection is a normally open connection or a protrusion on the piece of electronic equipment opening the connection if the connection is a normally closed connection.

5. The intelligent equipment rack of claim 1, wherein the instructions further cause the processor to:
display rack information on a display associated with the intelligent equipment rack, wherein the rack information is at least one of a rack identifier, rack coordinates, a row identifier, a room identifier, a building identifier, contact information for equipment administrator or owner, or a Uniform Resource Locator (URL) link to a rack in an enterprise system management software.

6. The intelligent equipment rack of claim 1, wherein the instructions further cause the processor to:
relay at least one of rack information or electronic equipment information from the rack information table to a central management system so that a detailed, dynamic, up-to-date, and accurate inventory of the electronic equipment is available for the intelligent equipment rack.

7. The intelligent equipment rack of claim 1, wherein the instructions further cause the processor to:
write rack information to the piece of electronic equipment, wherein the rack information comprises at least one of a room identifier or a building identifier.

8. A method, in a data processing system, for automatically detecting and locating equipment within an intelligent equipment rack, the method comprising:
determining, by a processor within the data processing system, whether a signal has been received indicating that a rack space in a plurality of rack spaces in the intelligent equipment rack has been occupied by a piece of electronic equipment; responsive to receiving the signal indicating that the rack space has been occupied by the piece of electronic equipment, update, by the processor, a rack information table in the memory with occupation information related to the rack space occupied by the piece of electronic equipment;
receiving by the processor, first equipment information from the piece of electronic equipment wherein the first equipment information comprises a number of rack space occupied by the electronic equipment, a connection point of the electronic equipment, and directions of other spaces occupied by the electronic equipment and updating, by the processor, the rack information table in the memory with the first equipment information provided by the piece of electronic equipment.

9. The method of claim 8, further comprising:
writing, by the processor, rack information to the piece of electronic equipment, wherein the rack information comprises at least one of a rack identifier, rack coordinates, or a row identifier.

10. The method of claim 8, further comprising:
receiving, by the processor, second equipment information specific to the piece of electronic equipment from the piece of electronic equipment, wherein the second equipment information comprises at least one of a unique network address, a network address of a system management interface, a media access control (MAC) address, a model number, a unique serial number, product release level, maintenance level, contact information for equipment administrator or owner, or device type; and
updating, by the processor, the rack information table in the memory with the second equipment information provided by the piece of electronic equipment.

11. The method of claim 8, wherein the signal identifies a specific rack space in the plurality of rack spaces, wherein the identification of the specific rack space is provided by a persistent storage associated with the specific rack space, wherein the signal is initiated by the piece of electronic equipment being installed in the intelligent equipment rack and a connection being made, and wherein the connection is at least one of a contact on the piece of electronic equipment closing the connection if the connection is a normally open connection or a protrusion on the piece of electronic equipment opening the connection if the connection is a normally closed connection.

12. The method of claim 8, further comprising:
displaying, by the processor, rack information on a display associated with the intelligent equipment rack, wherein the rack information is at least one of a rack identifier, rack coordinates, a row identifier, a room identifier, a building identifier, contact information for equipment administrator or owner, or a Uniform Resource Locator (URL) link to a rack in an enterprise system management software.

13. The method of claim 8, further comprising:
relaying, by the processor, at least one of rack information or electronic equipment information from the rack information table to a central management system so that a detailed, dynamic, up-to-date, and accurate inventory of the electronic equipment is available for the intelligent equipment rack.

14. The method of claim 8, further comprising:
writing, by the processor, rack information to the piece of electronic equipment, wherein the rack information comprises at least one of a room identifier or a building identifier.

15. A computer program product comprising a non-transitory computer readable storage medium having a computer readable program stored therein, wherein the computer readable program, when executed on a computing device, causes the computing device to:
determine whether a signal has been received indicating that a rack space in a plurality of rack spaces in an intelligent equipment rack has been occupied by a piece of electronic equipment; responsive to receiving the signal indicating that the rack space has been occupied by the piece of electronic equipment, update a rack information table in the memory with occupation information related to the rack space occupied by the piece of electronic equipment;
receive first equipment information from the piece of electronic equipment, wherein the f equipment information comprises a number of racks aces occupied by the electronic equipment, a connection point of the electronic equipment, and directions of other spaces occupied by the electronic equipment; and update the rack information table in the memory with the first equipment information provided by the piece of electronic equipment.

16. The computer program product of claim 15, wherein the computer readable program further causes the computing device to:

write rack information to the piece of electronic equipment, wherein the rack information comprises at least one of a rack identifier, rack coordinates, or a row identifier.

17. The computer program product of claim 15, wherein the computer readable program further causes the computing device to:

receive second equipment information specific to the piece of electronic equipment from the piece of electronic equipment, wherein the second equipment information comprises at least one of a unique network address, a network address of a system management interface, a media access control (MAC) address, a model number, a unique serial number, product release level, maintenance level, contact information for equipment administrator or owner, or device type; and update the rack information table in the memory with the second equipment information provided by the piece of electronic equipment.

18. The computer program product of claim 15, wherein the signal identifies a specific rack space in the plurality of rack spaces, wherein the identification of the specific rack space is provided by a persistent storage associated with the specific rack space, wherein the signal is initiated by the piece of electronic equipment being installed in the intelligent equipment rack and a connection being made, and wherein the connection is at least one of a contact on the piece of electronic equipment closing the connection if the connection is a normally open connection or a protrusion on the piece of electronic equipment opening the connection if the connection is a normally closed connection.

19. The computer program product of claim 15, wherein the computer readable program further causes the computing device to:

display rack information on a display associated with the intelligent equipment rack, wherein the rack information is at least one of a rack identifier, rack coordinates, a row identifier, a room identifier, a building identifier, contact information for equipment administrator or owner, or a Uniform Resource Locator (URL) link to a rack in an enterprise system management software.

20. The computer program product of claim 15, wherein the computer readable program further causes the computing device to:

relay at least one of rack information or electronic equipment information from the rack information table to a central management system so that a detailed, dynamic, up-to-date, and accurate inventory of the electronic equipment is available for the intelligent equipment rack.

21. The computer program product of claim 15, wherein the computer readable program further causes the computing device to:

write rack information to the piece of electronic equipment, wherein the rack information comprises at least one of a room identifier or a building identifier.

* * * * *